US008441262B2

(12) United States Patent
Minarcin et al.

(10) Patent No.: US 8,441,262 B2
(45) Date of Patent: May 14, 2013

(54) OPTIMIZATION OF ELECTRICAL COMPONENT PARAMETERS IN ENERGY STORAGE SYSTEM MODELS

(75) Inventors: Monika A. Minarcin, River Forest, IL (US); Brian J. Koch, Berkley, MI (US); Robert C. Baraszu, Dearborn, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 426 days.

(21) Appl. No.: 12/915,102

(22) Filed: Oct. 29, 2010

(65) Prior Publication Data
US 2012/0109617 A1    May 3, 2012

(51) Int. Cl.
*G01N 27/416*    (2006.01)

(52) U.S. Cl.
USPC ........................................................ 324/427

(58) Field of Classification Search .................. 320/107, 320/132, 149, 166, 104; 324/426, 427, 430, 324/433
See application file for complete search history.

(56) References Cited

U.S. PATENT DOCUMENTS 7,002,265 B2 *   2/2006   Potega .......................... 307/149
2009/0058361 A1 *   3/2009   John ............................. 320/128

* cited by examiner

*Primary Examiner* — Edward Tso
(74) *Attorney, Agent, or Firm* — Dinsmore & Shohl LLP

(57) ABSTRACT

A method of predicting an electrochemical mapping parameter in a vehicle that derives at least a portion of its motive power from an energy storage system is provided. The method may comprise providing a plurality of electrochemical mapping parameter sources capable of rendering one or more electrochemical mapping parameters selected from the group consisting of resistance and capacitance and selecting at least one electrochemical mapping parameter source capable of rendering one or more electrochemical mapping parameters based on the state of the energy storage system. The method may also comprise determining an adaptive gain and determining an adaptive factor based on the operating state of the vehicle or the energy storage system. The method may also comprise adapting the one or more electrochemical mapping parameters based on the adaptive factor and adaptive gain to provide an adapted electrochemical mapping parameter value.

6 Claims, 2 Drawing Sheets

OPTIMIZATION OF ELECTRICAL COMPONENT PARAMETERS IN ENERGY STORAGE SYSTEM MODELS

TECHNICAL FIELD

The invention disclosed herein generally relates to a device and method for predicting the electrochemical mapping parameters of an electrochemical energy storage system, and more particularly to methods for predicting the ohmic resistance, charge transfer resistance, diffusion resistance, double layer capacitance, diffusion capacitance or related electrochemical mapping parameters that can be used to improve the operability of an electrochemical energy storage system.

BACKGROUND

The increasing demand to provide both reduced emissions and improvements in fuel economy for automobiles has led to the development of alternate forms of vehicular propulsion. Two prominent forms of such new automotive architecture that can be used as alternatives to conventional gasoline-based internal combustion engines (ICEs) are electric vehicles (EVs) and hybrid vehicles, also called hybrid-electric vehicles (HEVs). An EV uses a battery-driven electric traction motor to provide propulsion to the wheels, while HEVs employ a combination of ICE, fuel cells or related sources, as well as electric power. Both demonstrate improved fuel economy and reduced emissions compared to their ICE counterpart.

In either the EV or HEV variant, it is the presence of a rechargeable energy storage system (RESS) that provides the primary motive force. The cell chemistries in these RESSs may be in the form of lead-acid, nickel-cadmium, nickel-metal hydride and lithium chemistries. Of these, the lithium chemistries have shown particular promise as a lightweight, long-lasting and volumetrically efficient device for automotive applications. Lithium cell chemistries cannot be overcharged without damaging the active materials. As a result, control systems must be employed in order to prevent any single cell in a pack configuration from experiencing an overcharge condition as there is no natural mechanism for cell equalization (as in nickel-metal hydride chemistries). In addition, control systems must also be employed to prevent over discharge conditions which can also damage battery performance. As such, control or related monitoring systems are used to detect voltage, current, temperature and related parameters indicative of the amount of stored charge in the energy storage system that is available to do work relative to a fully charged state.

RESSs in general and batteries in particular, are commonly represented as equivalent circuit models. The values of the electrochemical mapping parameters in such models may be estimated in a variety of ways for the purpose of predicting the response of the RESS to various inputs and conditions. However, the circuit models and solution methods never provide a perfect representation of RESS behavior, but rather serve their purpose better under some conditions than in others. Other approaches may employ various calibration schemes to improve the accuracy of the models, but adding more resistance-capacitance elements may result in a slower, and more cumbersome system that is impractical for use in a vehicle. If the predicted electrochemical mapping parameters are inaccurate, the operation of the vehicle and the RESS may be negatively impacted. For example, if the pack level resistance of the RESS is predicted inaccurately, the pack level power limit calculation will also be incorrect. This may cause inefficient and imprecise control of the RESS and vehicle.

Accordingly, there remains a need for a method to accurately characterize RESSs, and estimate the electrochemical mapping parameters exhibited therein, without significant additions to the computational throughput.

BRIEF DESCRIPTION OF THE SEVERAL VIEWS OF THE DRAWINGS

The following detailed description of specific embodiments of the present disclosure can be best understood when read in conjunction with the following drawings, where like structure is indicated with like reference numerals and in which.

SUMMARY OF INVENTION

Figure 1:
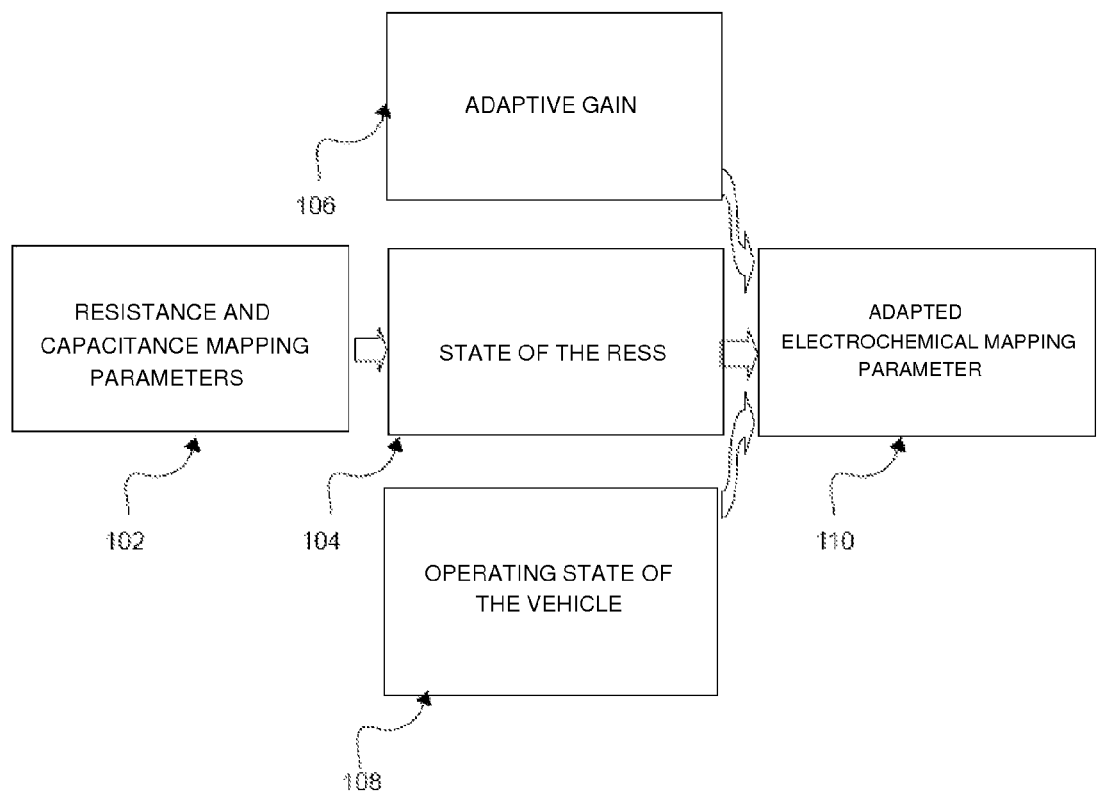
FIG. 1 shows a schematic view of a method of predicting at least one electrochemical mapping parameter in a vehicle that derives at least a portion of its motive power from a RESS in accordance with one or more embodiments of the present invention.

In one embodiment, a method of predicting an electrochemical mapping parameter in a vehicle that derives at least a portion of its motive power from a RESS is provided. The method may comprise providing a plurality of electrochemical mapping parameter sources capable of rendering one or more electrochemical mapping parameters selected from the group consisting of resistance and capacitance, and selecting at least one electrochemical mapping parameter source capable of rendering one or more electrochemical mapping parameters based on the state of the RESS. The method may also comprise determining an adaptive gain and determining an adaptive factor based on the operating state of the vehicle as it pertains to RESS operation and capability or the actual state of the RESS. The method may also comprise adapting the one or more electrochemical mapping parameters based on the adaptive factor and adaptive gain to provide an adapted electrochemical mapping parameter value.

In another embodiment, a system for controlling the operation of a vehicle that receives at least a portion of its motive power from a RESS is provided. The system comprises a memory device and a controller. The controller may be programmed to determine, from a number of electrochemical parameter sources, at least one electrochemical mapping parameter selected from the group consisting of resistance and capacitance based on the state of the RESS. The controller may also be programmed to determine an adaptive gain, determine an adaptive factor based on the operating state of the vehicle or the RESS, and adapt the one or more electrochemical mapping parameters based on the adaptive factor and adaptive gain to provide an adapted electrochemical mapping parameter value.

The methods may optionally comprise one or more of the following steps: modifying the adaptive gain based on an adaptive error counter, wherein the error counter records the magnitude and sign of at least one historical adaptive gain or at least one historical adaptive factor; adjusting the adapted electrochemical mapping parameter value relative to at least one limit selected from the group consisting of a maximum limit, a minimum limit, or combinations thereof; and offsetting the adapted electrochemical mapping parameter value based on a calibration maximum or minimum. The method may optionally comprise evolving the maximum and minimum limits based on a historical adaptive factor adjustment record. The plurality of sources may be selected from the group consisting of circuit equivalent models, predictive equations, and chemical mapping data. The operating state of the RESS is characterized by at least one measurement selected from the group consisting of a voltage measurement, a current measurement, a temperature measurement, and combinations thereof. The resistance may be selected from the group consisting of diffusion resistance, charge transfer resistance, and ohmic resistance. The capacitance may be selected from the group consisting of double layer capacitance and diffusion capacitance.

DETAILED DESCRIPTION

The present inventors have devised a method for predicting the electrochemical mapping parameters exhibited in a RESS by blending and combining sources to arrive an accurate electrochemical mapping parameter estimate for a wide range of operating conditions, without expanding the equivalent circuit model or utilizing extensive calibration mechanisms.

The methods and systems disclosed herein may operate in real-time, such that the various electrochemical mapping parameters may be determined during operation of the RESS, thus providing information to a vehicle's control system or controller while the vehicle is operating. It will be understood by one of ordinary skill that some of the calculation steps discussed herein may be conducted simultaneously, while others may be performed sequentially.

The method may be used with a variety of RESSs. The RESS may comprise a range of energy storage devices, including lithium ion batteries, alkaline batteries, and other chemical energy storage devices. The RESS may comprise a plurality of modules, wherein each of the plurality of cell modules each comprising of a plurality of energy storage cells. The methods described herein may be applied across the entire RESS, or the methods may be applied at the cellular or the modular level, such that the electrical and derivative calculations may be determined for the entire RESS, a single cell or module, or combinations thereof.

The RESS may be provided in a vehicle that derives at least a portion of its motive power from the RESS. The vehicle may comprise a hybrid electric vehicle that derives a portion of its motive power from a liquid fuel and a portion of its motive power from a RESS. The RESS may also be utilized in an electric vehicle that derives all of its motive power from the RESS. Alternatively, the RESS may be provided in other types of vehicles. While described in reference to an automobile, it will be appreciated by those skilled in the art that the methods disclosed herein may be provided on other platforms, including, but not limited to, trucks, motorcycles, buses, boats, generators, and the like. The vehicle may be front-wheel drive, rear-wheel drive, or combinations thereof. The RESS may also be used to supply energy to other devices as well besides vehicles, as will be recognized by one of ordinary skill in the art.

Referring to FIG. 1, in one embodiment, a method of predicting an electrochemical mapping parameter in a vehicle that derives at least a portion of its motive power from a RESS is provided. The method may comprise providing a plurality of electrochemical mapping parameter sources capable of rendering one or more electrochemical mapping parameters selected from the group consisting of resistance and capacitance (102), and selecting at least one electrochemical mapping parameter source capable of rendering the selected electrochemical mapping parameter based on the state of the RESS (104). The method may also comprise determining an adaptive gain (106) and an adaptive factor based on the operating state of the vehicle or RESS (108). The method may also comprise adapting one or more electrochemical mapping parameters based on the adaptive factor and adaptive gain to provide an adapted electrochemical mapping parameter value (110).

Referring to FIG. 1, one example of a method of predicting the electrochemical mapping parameters in a RESS is provided. The method may comprise providing a plurality of electrochemical mapping parameter sources capable of rendering one or more electrochemical mapping parameters selected from the group consisting of resistance and capacitance (102). These sources of electrochemical mapping parameters may be selected from the group comprising equivalent circuit models, chemical mapping data, and similar predictive models. Each source may be configured to provide at least one electrochemical mapping parameter estimate. By using the source of electrochemical mapping parameters at a state of the RESS in which they are most accurate, the method may determine electrochemical mapping parameters which closely represent the actual parameters, which could only be previously determined through the use of complex chemical mapping data, which is impractical for use in a vehicle containing a RESS.

In accordance with the method, one source of electrochemical mapping parameters may be favored for a particular state of a RESS. In a particular, no single source may accurately estimate the electrochemical mapping parameters, so the method may combine several sources to provide an overall result that more accurately represents the actual RESS characteristic. The method may generally select the best source for the electrochemical mapping parameter(s) desired, and move seamlessly from one source to another source as appropriate to give an optimal prediction of the RESS behavior.

In one configuration, the method may comprise measuring the state of the RESS. The state of the RESS may comprise the electrical conditions that affect the electrochemical mapping parameters of a RESS. The state of the RESS may be characterized by certain variables, including but not limited to, past and present data regarding temperature, age, voltage, and current. Each source may take into account the state of the RESS in providing the estimates of the various electrochemical mapping parameters. The measured inputs of current, voltage, and temperature may be obtained through a combination of probes and monitors as will be appreciated by one of ordinary skill.

The vehicle may comprise a control system capable of monitoring the state of the RESS through analog signals of voltage, current and temperature. The control system may convert voltage, current, and temperature from analog to digital based signals and send them to a central control module. The central control module may be configured to store and operate the methods disclosed herein. It may also communicate the calculated electrochemical mapping parameters to other systems of the vehicle, which allows such systems to operate the vehicle to maximize performance, efficiency, longevity, and other conditions parameters.

The methods and devices described herein may also be used to adjust more than one electrochemical mapping parameter at a time for a RESS. For example, one source may be selected for its accuracy in assessing the ohmic resistance with regard to aging. The electrochemical mapping parameter estimates from the plurality of sources may then be utilized within the same circuit model to provide a more accurate characterization of the RESS. In one configuration, under some states of a RESS, a single source may be selected to provide all the electrochemical mapping parameters necessary to accurately characterize the RESS. By determining the most accurate electrochemical mapping parameter source, for the particular conditions of the RESS, the methods disclosed herein may closely predict the actual electrochemical mapping parameters present in the RESS.

Figure 2:
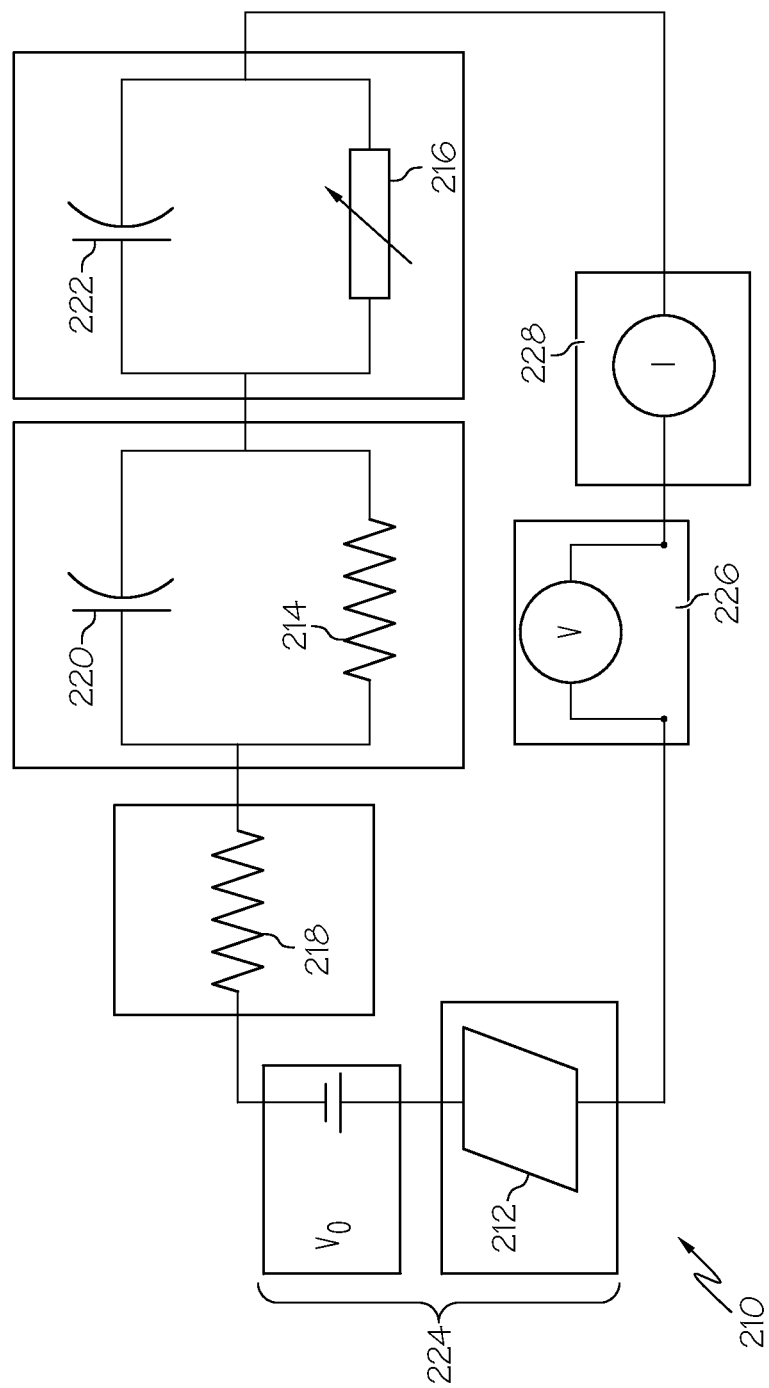
FIG. 2 shows a schematic view of an equivalent circuit model in accordance with one or more embodiments of the present invention.

In one embodiment, one of the sources of electrochemical mapping parameters may comprise an equivalent circuit model. However, other sources of the electrochemical mapping parameters are also contemplated. FIG. 2 is provided as a possible example. The type of equivalent circuit model used may vary in complexity, as will be appreciated by one of ordinary skill in the art. The equivalent circuit model(s) may be selected to accommodate a variety of time constants that may be present in a RESS, as well as the various resistance and capacitance components. The equivalent circuit models may be provided with variable amount of resistance and capacitance elements that may be useful in characterizing the RESS.

The equivalent circuit models may represent a plurality of resistance and capacitance elements that may be determined for a particular state of the RESS. Referring to FIG. 2, one example of an equivalent circuit model 210 of a RESS is provided. The capacitance in the circuit model represent the accumulation of charge at the electrode interface, and the resistance may represent the resistance to electron transfer across the interface. Each of the variables and elements mentioned above may be assigned values by means of look-up tables, heuristic algorithms, or by solving a number mathematical expressions describing the electrical circuit to provide electrochemical mapping parameter estimates for a represented RESS.

The resistance and capacitance elements may comprise the electrochemical mapping parameters of the RESS. Referring to FIG. 2, the resistance may comprise various components of resistance, including, but not limited to, the charge transfer resistance 214, diffusion resistance 216 and ohmic resistance 218. Capacitance may include various components of capacitance in a RESS, including but not limited to, double layer capacitance 220 and diffusion capacitance 222.

The hysteresis voltage 212 is observed upon reversal of current flow in the battery and is manifested as a failure of the voltage to retrace the path it took prior to the current reversal. This hysteresis gives rise to a separate open circuit voltage ($V_{oc}$) versus state of charge (SOC) curves for charge-increasing and charge-decreasing operations. The $V_{oc}$ 224 represents the difference in electrical potential between two terminals of a device when there is no external load connected.

The ohmic resistance 218 element may represent the resistance of the electrical conductor elements of a RESS, which may comprise current collectors, tabs, bus bars, terminals, active materials, and conductive materials. The diffusion resistance 216 in conjunction with the diffusion capacitance 222 may represent the effect of hindrances to mass transport within the RESS. The charge transfer resistance 214 may represent the resistance to electron transfer across the interface of the double layer present in a RESS. The double layer capacitance 220 represents the ability of an electrical double layer to store the electrical charge as a capacitor. The voltage 226 and current 228 may be provided to the equivalent circuit model 210 as part of the state of the RESS input. However, it is also contemplated that other inputs may be provided to the equivalent circuit model 210 aside from voltage and current, which would lend themselves to a more complete characterization of the RESS, and incorporate additional factors, such as temperature, and aging effects.

In one embodiment, one source of electrochemical mapping parameters may comprise chemical parameter mapping data. The chemical mapping data may comprise a variety of forms. In one embodiment, the chemical parameter mapping data may be provided in a lookup table for a variety of temperatures. The chemical parameter mapping data may be derived from various electrochemical testing procedures applied to the RESS. For example, the chemical parameter mapping data may comprise the results of Computational Fluid Dynamics (CFD), Peukert testing, and Hybrid Power Pulse Characterization (HPPC) testing. The chemical parameter mapping data may also comprise other forms of testing that will be appreciated by one of ordinary skill.

The chemical parameter mapping data may be limited to discrete points, as defined by the experiments performed. It is impractical to provide chemical parameter mapping data at all of the conditions that a RESS experiences. Because real-world operation of a vehicle often extends beyond those discrete points, chemical parameter mapping data may be not be available for all conditions of RESS operation. Accordingly, the method may comprise adjusting the chemical parameter mapping data to the state of the RESS, in order to provide a comparable estimate. In one configuration, adjusting the chemical parameter mapping data may comprise interpolating or averaging the chemical parameter mapping data to provide an estimate for the temperature value corresponding to the state of the RESS. Alternatively, the method may compare the chemical parameter mapping data corresponding to the temperature nearest the temperature corresponding to the state of the RESS. Other forms of incorporating the chemical parameter mapping data into the methods disclosed herein may also be utilized.

In one embodiment, the method may comprise providing an adaptive error counter. The adaptive error counter may record the magnitude and sign of the historical adaptive gain factors. By "historical," it is understood to mean the values that have been implemented by the method previously. The historical adaptive gain factors may be stored in a memory system, for later comparison and modeling. The memory system may be configured to store any number of historical factors.

The adaptive error counter may track historical adaptive gains, and assign a value to each gain applied. For example, the adaptive error counter may associate each adaptive gain a value ranging from −7 to +7, depending on the magnitude of the historical adaptive gain. If the accumulated adaptive error count is very large, the adaptive gain may be increased beyond what would be ordinarily provided. Similarly, if the accumulated adaptive error count is very small, the adaptive gain may be below what would be ordinarily provided in the absence of the historical adaptive error counter.

The adaptive error counter may account for a range of historical adaptive gains depending on the chemistry, operating range, and state of the RESS. It is contemplated that the algorithm may be programmed to update the adaptive error counter automatically to account for the above mentioned factors. The adaptive error effect is configurable to provide the amount of historical adaptive factors and adaptive gains pertaining to the needs of the algorithm. For example, the last ten values of the adaptive gain may be averaged, and compared to the adaptive gain presently calculated. Based on the results of the comparison, the presently calculated adaptive gain may be modified. For example, if the stored adaptive gain factors indicate progressively smaller adaptive gains, the method may reduce the presently calculated adaptive gain lower than then the calculated value, and apply the modified gain instead. This allows the method to converge faster than would be otherwise achieved. However, in some situations, the method may provide the adaptive gain to be slower than the progression of adaptive gains would suggest.

Referring again to FIG. 1, in yet another embodiment, the method may comprise determining adaptive gain (106). The adaptive gain may be provided in a table, or algorithm as appreciated by one of ordinary skill. In one embodiment, the adaptive gain may be based on the adaptive error counter.

The adaptive gain may be determined from the equation:

adaptive gain=gain table(ABS) (adaptive error counter)

The adaptive gain may represent filter gains for each electrochemical mapping parameter with respect to the temperature of the RESS. The adaptive gain cooperates with other factors to perform pre-programmed adaptation modes, as described below. In one configuration, the adaptive gain may be configured to provide at least four adaptation modes. Alternatively, the adaptive gain may be provide other adaptation modes, which represent various methods of converging the various electrochemical mapping parameters provided by the plurality of sources.

The four adaptation modes may include a converged mode, an unconverged mode, a region base converged mode, and a no-converge mode. The converged mode may allow only small adaptive changes to occur between the sources to maintain the target value of an electrochemical mapping parameter "X" as provided by at least one source. The region base converged mode may allow corrective action to compensate for impending load or state. The region base converged mode may also allow corrective action to predict power limits, capacity, and voltage of a RESS. The region-based converged mode may include adapting the electrochemical mapping parameters through convergence with a more accurate source, the electrochemical mapping parameter derivative calculations may also converge. The unconverged mode may allow large adaptive modifications to quickly adapt electrochemical mapping parameter "X" to a value that meets the target value provided by another source. The unconverged mode may allow electrochemical mapping parameters to reach acceptable limits rapidly. Accordingly, the unconverged mode may be desirable when the power limits and other derivative calculations of the electrical power limits must be determined quickly, i.e., during vehicle start-up. In the no converge mode, the method may go back to the calculated value, and no adaptation may be made.

Derivative calculations of the electrochemical mapping parameters may include those calculations that depend on the electrochemical mapping parameters. For example, derivative calculations may include power limits of the RESS, voltage, and capacity determinations. Other derivative calculations are also contemplated, as will be appreciated by one of ordinary skill.

The adaptive gain function may be triggered at a range of timing intervals. At every interval, the adaptive gain values may be stored, and at least one of the old values may be removed from local memory. The memory functions described herein may be appreciated by one of ordinary skill.

In another embodiment, the method may comprise determining an operating state of the vehicle. The operating state of the vehicle may refer to known vehicle events that affect either the discharge, charge, or both of the RESS. The operating state of the vehicle may include, but is not limited to, regenerative braking, charging, discharging, hill climbing, performance mode, idle mode, and others. The vehicle event may be selected by a user in one possible configuration, such that the RESS may be configured to perform a certain way, and accordingly, the methods disclosed herein will adapt to the particular conditions necessitated by the vehicle event.

The method may comprise determining an adaptive factor based on the operating state of the vehicle or RESS (110). For example, an aggressive driver may be characterized by a high RMS current that may be associated with large amounts of diffusion and polarization within the RESS depending on the chemistry. Accordingly, if the source of the electrochemical mapping parameters were one type of equivalent circuit model, the diffusion/polarization effect may not be properly accounted for, and power limits (a derivative calculation) calculated for the RESS based on those electrochemical mapping parameters may be overestimated. In order to solve this problem, if a certain RMS current is reached, it may be considered an aggressive driver operating state. Once the aggressive driver operating state has been assigned, the method may select an adaptive factor appropriate to the operating state. For the aggressive driver operating state, the resistance values calculated by an equivalent circuit model may be adjusted higher, in accordance with what is actually going on electrochemically in the RESS. Once the adaptive factor is determined, it is applied to the at least one source to modify the predicted electrochemical mapping parameter value. By utilizing the adaptive factor, the known deficiencies of the plurality of sources are compensated for, and corrected.

The method may comprise adapting the one or more electrochemical mapping parameters based on the adaptive factor and the adaptive gain to provide an adapted electrochemical mapping parameter value. The electrochemical mapping parameters from one source may be determined, and the method may compute the correction to those calculations based on the other sources of the electrochemical mapping parameters. Therefore, if one source computes the electrochemical mapping parameter signal as a linear slope, but according to other sources, the shape of the signal resembles more of a parabola, the algorithm may output the full correction signal as that parabola shape through means of adapting the electrochemical mapping parameter with the adaptive factor.

The adaptive factor allows a percentage of the above mentioned full correction signal to be applied to the adaptive modification. The adaptive factor represents how reliable the full correction computation is believed to be, and allows smaller adaptive corrections where the sources are believed to be less reliable, and where overcorrecting the adjustment may result in undesirable consequences. The adaptive factor may be based on the operating state of the RESS. Adapting the at least one selected electrochemical mapping parameter may comprise increasing or decreasing its value based on the adaptive factor and the adaptive gain. In some conditions, adapted electrochemical mapping parameter may be increased, wherein under other conditions, the adapted electrochemical mapping parameter may be decreased, all relative to the at least one selected electrochemical mapping parameter.

In yet another embodiment, the method may comprise adjusting the adapted electrochemical mapping parameter value relative to at least one limit selected from the group consisting of a maximum limit, a minimum limit and combinations thereof. The maximum and minimum limits may comprise the end of life or beginning of life specifications or limits derived from previous testing or vehicle usage knowledge. The maximum and minimum limits may represent known maximums and minimums for the RESSs when they are new, and at the end of life point as determined by the application. The maximum and minimum limits may also comprise restrictions provided by the cell chemistry supplier or limits provided to ensure the desired longevity or performance characteristics.

The maximum and minimum limits may comprise maximum and minimum operational values for each of the electrochemical mapping parameters. These maximum and minimum operational values may be discovered from complex electrochemical modeling, or from tests like HPPC or Peukert testing, by inputting the temperature, age, and RMS current for a RESS.

For example, for a particular RMS voltage, one source, such as a parameter estimator based on a circuit model, generates a value for electrochemical mapping parameter "X." However, the value "X" is underestimated, as determined by another means, such as a direct measurement of the parameter. Therefore, the reported value of parameter "X" from the circuit model will be adjusted to a more-realistic value. The adjustment may be effectuated by a combination of the adaptive factor, the adaptive gain, and the maximum and minimum limits.

The method may also comprise evolving the maximum and minimum limits based on historical adaptations. The evolving may comprise a fast learning or a slow learning calibration depending on the desired performance of the RESSs. A fast learning calibration may be desirable to achieve optimum RESS performance. A slow learning calibration may be desirable to achieve higher stability and extended life of the RESS.

The method may also comprise offsetting the adapted electrochemical mapping parameter value based on a calibration maximum or minimum. A calibration maximum or minimum may be provided in the case where a specific adaptation is to be prevented for life or for diagnostics.

The adaptive algorithm may be disabled under conditions that could be potentially cause the adaptive parameters to deviate from their optimal values. The disabling of adaptation may be activated through the detection of sub-optimal signal excitation, fault flags, load, discernment of which parameters to adapt, correction computations, iterative counters, error counters, convergence, reset to fast adaptive, and cross adaptive (adapt two electrochemical mapping parameters at the same time if one does not show a need in order to replicate a phenomena).

In accordance with another aspect of the present invention, an article of manufacture useable to predict electrochemical mapping parameters of a RESS is disclosed. The article of manufacture comprises a computer-usable medium having computer-executable instructions adapted to electrochemical mapping parameter predictions using the methodology described above. The computer-executable instructions comprise equations used to determine at least one electrochemical mapping parameter from the group consisting of resistance and capacitance from a plurality sources and selecting at least one electrochemical mapping parameter source configured to provide at least one electrochemical mapping parameter based on the state of the RESS.

The computer-executable instructions may also be used to determine an adaptive gain based on an adaptive error counter, determine an adaptive factor based on the operating state of the vehicle or the RESS, and adapting the one or more electrochemical mapping parameters based on the adaptive factor and adaptive gain to provide an adapted electrochemical mapping parameter value. It is also contemplated that other computer executable instructions may be used in conjunction with the present invention. The article is particularly well-suited for determining the electrochemical mapping parameters, where a single source does not accurately reflect the resistance or capacitance of the RESS.

For the purposes of describing and defining the present invention, it is noted that reference herein to a variable being a "function" of a parameter or another variable is not intended to denote that the variable is exclusively a function of the listed parameter or variable. Rather, reference herein to a variable that is a "function" of a listed parameter is intended to be open ended such that the variable may be a function of a single parameter or a plurality of parameters.

It is also noted that recitations herein of "at least one" component, element, etc., should not be used to create an inference that the alternative use of the articles "a" or "an" should be limited to a single component, element, etc.

It is noted that recitations herein of a component of the present disclosure being "programmed" in a particular way, "configured" or "programmed" to embody a particular property, or function in a particular manner, are structural recitations, as opposed to recitations of intended use. More specifically, the references herein to the manner in which a component is "programmed" or "configured" denotes an existing physical condition of the component and, as such, is to be taken as a definite recitation of the structural characteristics of the component.

It is noted that terms like "preferably," "commonly," and "typically," when utilized herein, are not utilized to limit the scope of the claimed invention or to imply that certain features are critical, essential, or even important to the structure or function of the claimed invention. Rather, these terms are merely intended to identify particular aspects of an embodiment of the present disclosure or to emphasize alternative or additional features that may or may not be utilized in a particular embodiment of the present disclosure.

For the purposes of describing and defining the present invention it is noted that the terms "substantially" and "approximately" are utilized herein to represent the inherent degree of uncertainty that may be attributed to any quantitative comparison, value, measurement, or other representation. The terms "substantially" and "approximately" are also utilized herein to represent the degree by which a quantitative representation may vary from a stated reference without resulting in a change in the basic function of the subject matter at issue.

Having described the subject matter of the present disclosure in detail and by reference to specific embodiments thereof, it is noted that the various details disclosed herein should not be taken to imply that these details relate to elements that are essential components of the various embodiments described herein, even in cases where a particular element is illustrated in each of the drawings that accompany the present description. Rather, the claims appended hereto should be taken as the sole representation of the breadth of the present disclosure and the corresponding scope of the various inventions described herein. Further, it will be apparent that modifications and variations are possible without departing from the scope of the invention defined in the appended claims. More specifically, although some aspects of the present disclosure are identified herein as preferred or particularly advantageous, it is contemplated that the present disclosure is not necessarily limited to these aspects.

It is noted that one or more of the following claims utilize the term "wherein" as a transitional phrase. For the purposes of defining the present invention, it is noted that this term is introduced in the claims as an open-ended transitional phrase that is used to introduce a recitation of a series of characteristics of the structure and should be interpreted in like manner as the more commonly used open-ended preamble term "comprising."

What is claimed is:

1. A system for controlling a vehicle based on a plurality of electrochemical mapping parameters in an energy storage system used to provide at least a portion of motive power to an automobile, the system comprising:
   a memory device and a controller, wherein the controller is programmed to:
      provide a plurality of electrochemical mapping parameter sources capable of rendering one or more electrochemical mapping parameters selected from the group consisting of resistance and capacitance, wherein the resistance is selected from the group consisting of diffusion resistance, charge transfer resistance, and ohmic resistance, and wherein the capacitance is selected from the group consisting of double layer capacitance and diffusion capacitance;
      select at least one electrochemical mapping parameter source based on the state of the energy storage system, wherein the operating state of the energy storage system is characterized by at least one measurement selected from the group consisting of a voltage measurement, a current measurement, a temperature measurement, and combinations thereof;
      determine an adaptive gain;
      determine an adaptive factor based on the operating state of the vehicle or the energy storage system; and
      adapt the one or more electrochemical mapping parameters based on the adaptive factor and adaptive gain to provide an adapted electrochemical mapping parameter value.

2. The system of claim 1, wherein the adaptive gain is based on an adaptive error counter, wherein the error counter records the magnitude and sign of at least one historical adaptive gain or at least one historical adaptive factor.

3. The system of claim 1, wherein the electrochemical mapping parameter is adapted to an electrochemical mapping parameter value relative to at least one limit selected from the group consisting of a maximum limit, a minimum limit, or combinations thereof.

4. The system of claim 3, wherein the controller may be programmed to evolve the maximum and minimum limits based on a historical adaptive factor adjustment record.

5. The system of claim 1, wherein the controller is programmed to offset the adapted electrochemical mapping parameter based on a calibration maximum or minimum.

6. The system of claim 1, wherein the plurality of sources may be selected from the group consisting of circuit equivalent models, predictive equations, and chemical mapping data.

* * * * *